United States Patent
Stone

(10) Patent No.: US 9,242,501 B2
(45) Date of Patent: Jan. 26, 2016

(54) PRINTED ARTICLE

(75) Inventor: Kate Stone, Cambridge (GB)

(73) Assignee: NOVALIA LTD., Cambridge (GB)

( * ) Notice: Subject to any disclaimer, the term of this patent is extended or adjusted under 35 U.S.C. 154(b) by 589 days.

(21) Appl. No.: 13/056,613

(22) PCT Filed: Jul. 31, 2009

(86) PCT No.: PCT/GB2009/050957
§ 371 (c)(1),
(2), (4) Date: Mar. 29, 2011

(87) PCT Pub. No.: WO2010/013062
PCT Pub. Date: Feb. 4, 2010

(65) Prior Publication Data
US 2011/0179641 A1    Jul. 28, 2011

(30) Foreign Application Priority Data

Jul. 31, 2008    (GB) .................................. 0813984.2

(51) Int. Cl.
| | |
|---|---|
| H05K 3/30 | (2006.01) |
| B42D 3/12 | (2006.01) |
| B42D 15/02 | (2006.01) |
| B44F 3/00 | (2006.01) |
| H05K 1/02 | (2006.01) |
| A63F 9/24 | (2006.01) |
| A63F 11/00 | (2006.01) |
| H05K 3/12 | (2006.01) |

(52) U.S. Cl.
CPC .............. *B42D 3/123* (2013.01); *B42D 15/022* (2013.01); *B44F 3/00* (2013.01); *H05K 1/0266* (2013.01); *A63F 9/24* (2013.01); *A63F 2011/0081* (2013.01); *B42D 2033/46* (2013.01); *B42P 2221/00* (2013.01); *H05K 3/12* (2013.01); *H05K 2201/09936* (2013.01); *H05K 2201/10037* (2013.01); *H05K 2201/10106* (2013.01); *Y10T 29/4913* (2015.01); *Y10T 428/24802* (2015.01)

(58) Field of Classification Search
CPC .. B42D 3/123; B42D 2033/46; B42D 15/022; B44F 3/00; H05K 1/0266; Y10T 29/4913
USPC .......... 360/132; 400/107, 118.3; 29/600, 605, 29/830, 831, 832, 846
See application file for complete search history.

(56) References Cited

U.S. PATENT DOCUMENTS

| | | | | |
|---|---|---|---|---|
| 5,622,652 | A * | 4/1997 | Kucherovsky et al. | ........ 252/511 |
| 5,708,545 | A * | 1/1998 | Goken et al. | .................. 360/132 |
| 2003/0197461 | A1* | 10/2003 | Fukuda et al. | ................ 313/493 |
| 2004/0000429 | A1* | 1/2004 | Furusawa et al. | ............. 174/264 |
| 2007/0144913 | A1 | 6/2007 | Muraoka | |
| 2007/0273951 | A1* | 11/2007 | Ribi | ............................. 359/237 |

FOREIGN PATENT DOCUMENTS

| | | |
|---|---|---|
| GB | 2132135 | 7/1984 |
| JP | 11-305645 | 11/1999 |

* cited by examiner

*Primary Examiner* — Peter DungBa Vo
*Assistant Examiner* — Jeffrey T Carley
(74) *Attorney, Agent, or Firm* — Stroock & Stroock & Lavan LLP

(57) ABSTRACT

A printed article (1) comprises a substrate (2) and an image (3) printed on the substrate. The image includes line art (4) comprises conductive ink. The image includes representations of at least two items (6$_1$, 6$_2$) which overlap such that line art of a first item is joined at least one point (7$_1$) to line art of a second item.

7 Claims, 3 Drawing Sheets

PRINTED ARTICLE

CROSS-REFERENCE TO RELATED APPLICATIONS

This application is a national stage application under 35 U.S.C. 371 based on and claiming the benefit of International Application Serial No. PCT/GB2009/050957 filed on Jul. 31, 2009, which claims the benefit of priority from United Kingdom Patent Application No. 0813984.2 filed on Jul. 31, 2008, the entire contents of each of which are incorporated herein by reference.

The present invention relates to a printed article.

Electrical components can be integrated into printed articles, such as books and greeting cards. Conductive tracks can be used to interconnect different electrical components. For example, conductive tracks can be run under, over or beside images printed on the article.

Routing conductive tracks can be difficult. For example, a non-conductive ink may not print well over a conductive ink or vice versa and so conductive tracks may need to be routed around, rather than across, images. Even if conductive tracks cross an image, the presence of conductive tracks may spoil the visual appearance of the article.

According to a first aspect of the present invention there is provided a printed article comprising a substrate and an image printed on the substrate, wherein the image includes line art comprising conductive ink, the image including representations of at least two items which items overlap such that the line art of a first item is joined at least at one point to line art of a second item.

Thus, conductive tracks can be routed through the image, using the line art as "link art". Furthermore, the presence of conductive tracks can effectively be concealed from the user.

The image may be a perspective image of the items.

The image may comprise at three items, wherein the representations of the first and second items overlap, the representations of the second and third items overlap and the representation of first and third items do not overlap.

This can make routing of tracks through the image easier to achieve.

According to a second aspect of the present invention there is provided a method of forming a printed article, the method comprising providing an image which includes line art, arranging the line art so that representations of at least two items overlap such that line art of a first item is joined at least one point to line art of a second item and printing the line art using conductive ink.

The method may further comprise mounting electronic components to the line art.

Embodiments of the present invention will now be described, by way of example, with reference to the accompanying drawings in which.

Figure 4A:
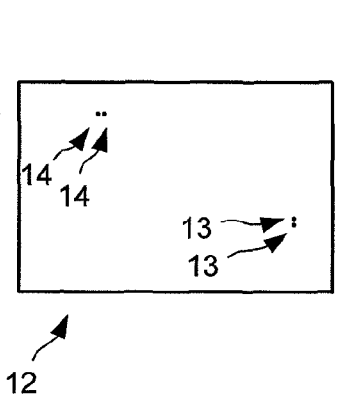
Figure 4B:
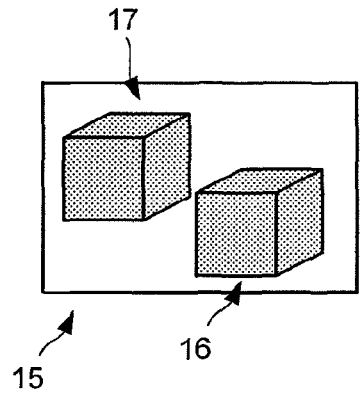
Figure 4C:
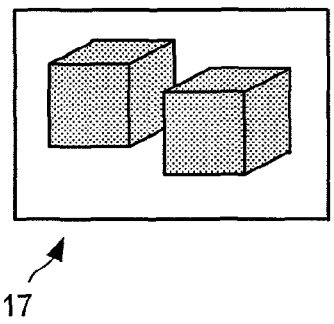
Figure 5:
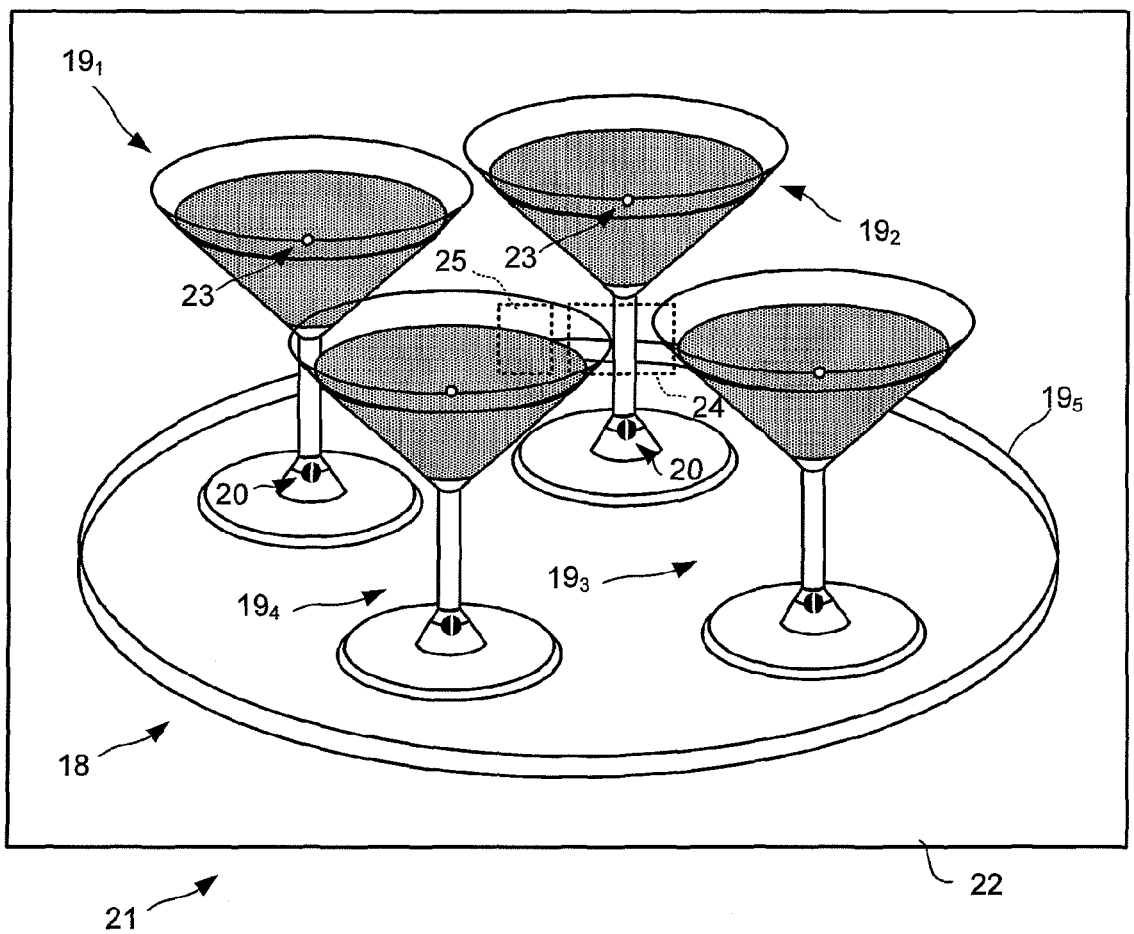

FIGS. 4a, 4b, and 4c illustrate different stages during a design process; and FIG. 5 is a plan view of a more complicated printed image.

Figure 1:
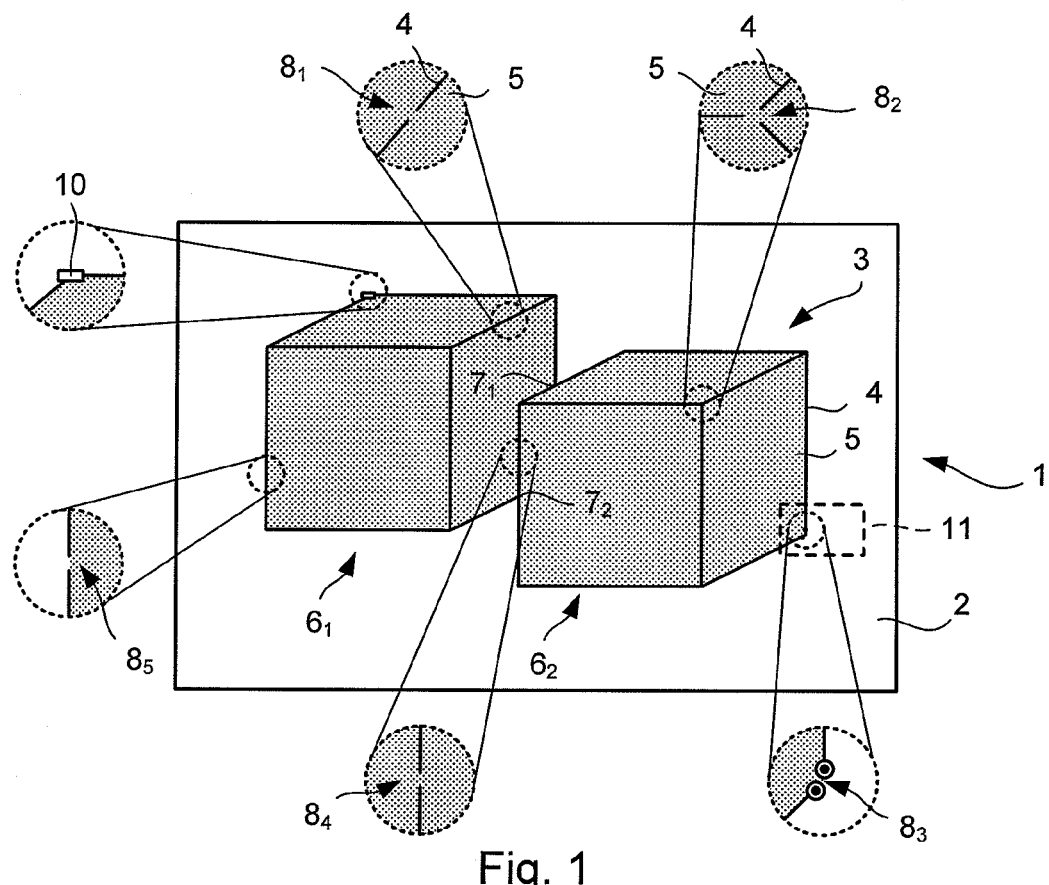
FIG. 1 is a plan view of a sheet with a printed image.
Figure 2:
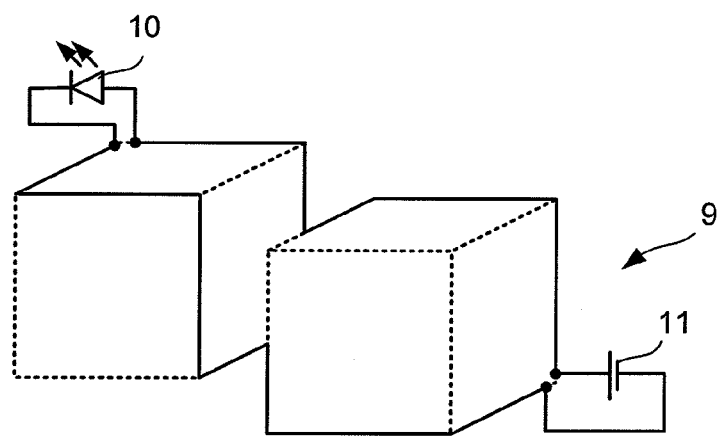
FIG. 2 illustrates the circuit formed by the image and electronic components.

Referring to FIG. 1, a printed article 1 in accordance with the present invention is shown.

The printed article 1 includes a substrate 2, for example a sheet of card, on which is printed an image 3. The image 3 includes line art 4 comprising conductive ink. The line art 4 is formed of lines which provide conductive tracks. At least some of the lines branch and/or meet other lines. The image 3 may also include shaded or coloured regions 5 comprising non-conductive ink.

The line art 4 comprises a silver-based conductive ink. Suitable conductive inks are available from Sun Chemical Corporation, Parsippany, N.J., USA. Other forms of conductive ink can be used, such as copper-based conductive ink, other forms of metallic-based conductive ink or a carbon-based conductive ink.

The image 3 is formed using a printing process, such as screen printing, ink jet printing, flexography or offset printing.

The line art 3 has a line width, w, which is of the order of 100 μm, for example, between about 0.5 to 1 mm. However, the line width may be smaller. The line width may vary along a length of a line and from line to line. The thickness of the (dried or cured) ink is about 2 μm using flexography, about 10 to 20 μm using screen printing and about 1 μm using offset printing. The thickness may be smaller or greater.

The image 3 includes representations of at least two items $6_1$, $6_2$. In this example, the image 3 is a perspective view of two cubes. The items $6_1$, $6_2$ overlap such that the line art 4 of the items $6_1$, $6_2$ overlaps and is joined at connection points $7_1$, $7_2$. The line art 4 also include breaks $8_1$, $8_2$, $8_3$, $8_4$, $8_5$ in the lines or at junctions which may be imperceptible to the naked eye. The breaks $8_1$, $8_2$, $8_3$, $8_4$, $8_5$ may be hidden may overprinting with non-conductive, colour-matched ink.

The printed article 1 supports a circuit 9. In this example, a simple circuit is used which a light emitting diode 10 and a battery 11, for example in the form of a thin lithium polymer battery.

The light emitting diode 10 is attached directly onto the conductive tracks using conductive glue or ink. The line art 4 includes a break (not shown) beneath the light emitting diode so as to isolate the terminals of the light emitting diode 10. This break (not shown) may take the form of a punch or slot which can help to avoid conductive glue flowing together to create a short.

The battery 11 is mounted on the reverse side of the card. The card includes contact holes 13 and lie over the terminals 14 of the battery 11. Conductive ink (not shown) is used to fill the holes 13 and connect the battery terminals 11 to the line art 4, i.e. conductive tracks.

Referring to FIGS. 3 and 4a, 4b and 4c, a process of forming the printed article will now be illustrated.

Figure 3:
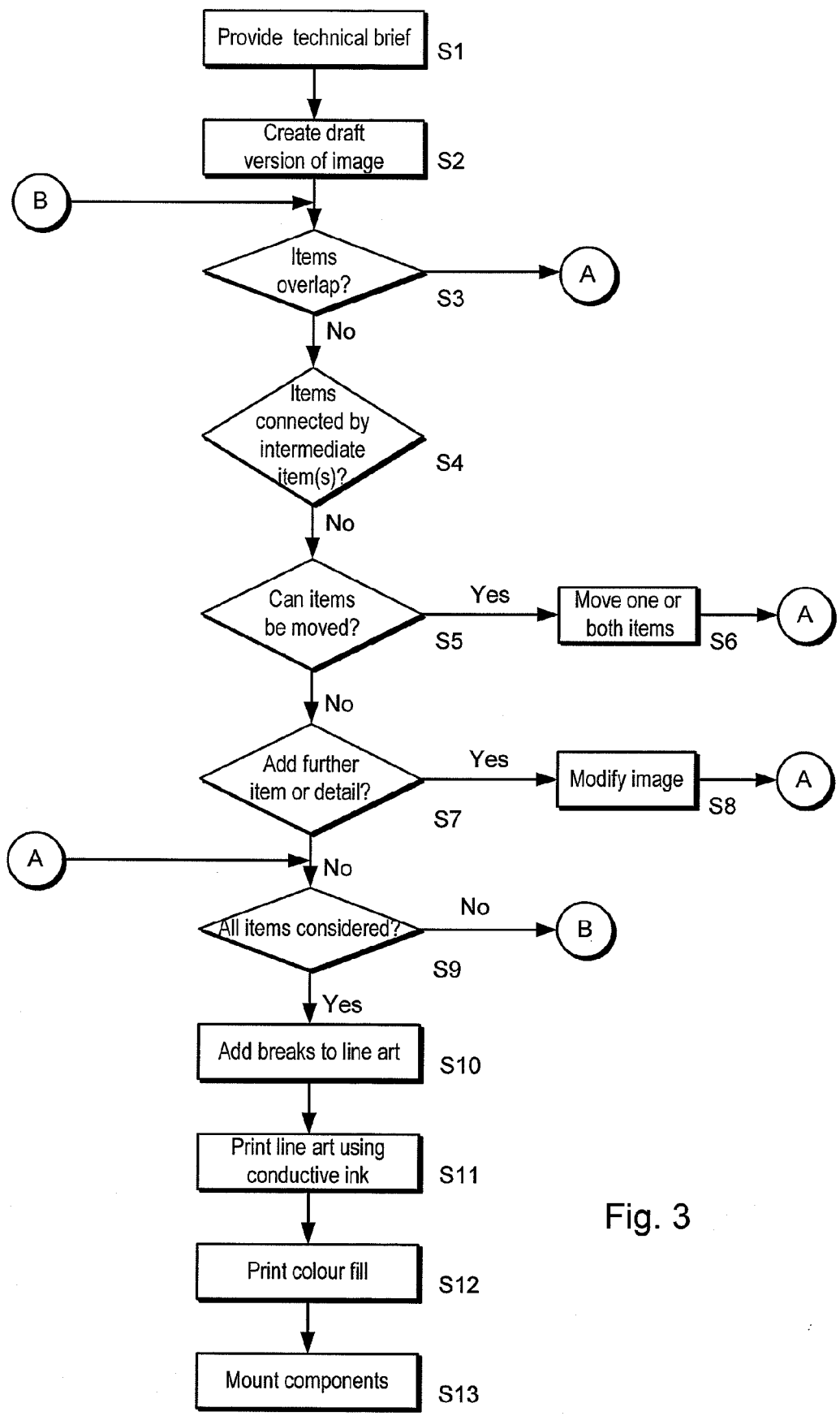
FIG. 3 is process flow diagram of a method of making a printed article.

Referring in particular to FIGS. 3 and 4a, circuit designer provides a graphical designer or artist with a technical brief 12 which include the number of tracks required and the start and end points 13, 14 for each conductive track (step S1). The graphical designer creates a first version 15 of the image which includes at least two items 16, 17 (step S2).

Alternatively, the graphical designer may first generate a first version of the image 2 and provide the image to the circuit designer with a creative brief, e.g. listing possible audio/visual effects such as flashing lights. The circuit designer may see if the creative brief is achievable and, if not, provide a more focused technical brief setting out requirements in terms of, for example, whether additional tracks are needed and, if so, the start and end points for each additional tracks.

Starting with a first pair of items 16, 17, the designer checks whether a pair of items 16, 17 overlap (step S3). If the pair of items 16, 17 do not overlap, the designer checks whether one or both items 16, 17 overlap via one or more intermediate objects (step S4). If the items 16, 17 still do not overlap even via an intermediate object(s), the designer decides whether one or both items can be moved, re-sized and or stretched so that they do overlap (steps S5). If so, the items are modified accordingly (step S6). Otherwise, the designer considers whether a further item or detail can be added (step S7). If such modification is possible, then it is made (step S8). The process is repeated for each pair of items (step S9) and may be repeated for the image again until the technical brief is achieved.

More than one pair of items and more than one step can be considered simultaneously.

Referring to FIGS. 3 and 4c, once a design 17 has been finalised, the circuit designer adds breaks to produce the required tracks (step S10).

The final version of the image 2, including the line breaks, is then printed (step S11). If the image 2 includes regions which are filled in, then these regions are printed (step S12). Electronic components are then mounted to the tracks to provide a functional circuit (steps S13).

By using more complicated line art, additional tracks can be provided and so more complicated circuits can be provided. The circuit can also conceal contact switches.

A graphical designer can help a circuit designer by overlapping items as much as possible and by providing as much detail into the line art as much as possible. An engineer can then "cut" the line art (i.e. forms breaks) at given points to establish routes through the image.

Line art of different items can be joined by the line art of one or more intermediate items. For example, first and second items which do not directly overlap can be connected via a third item which overlaps with both first and second items. This allows even greater flexibility for finding routes through the image.

Referring to FIG. 5, illustrates a more complicated image 18 comprising five items $19_1, 19_2, 19_3, 19_4, 19_5$, namely four cocktail glasses $19_1, 19_2, 19_3, 19_4$ and a tray $19_5$. The image 18 can include tracks and touch sensitive switches 20, each switch being a pair of conductive pads which can be bridged by a finger.

A printed article 21 may be formed on a piece of card 22 which includes the image 18 to which are mounted light emitting diodes 23. A circuit board 24 carrying a microcontroller (not shown) and battery 25 can be provided on a reverse side.

This arrangement can be used, for example, to create a memory game, similar to the Simon game, described in U.S. Pat. No. 4,207,087.

It will be appreciated that many modifications may be made to the embodiments hereinbefore described. For example, the printed article may be a book (including, for example, a hardback book, a paperback, a board book, etc.), a greeting card, a postcard, a poster, a calendar (e.g. wall hanging or triangular desk calendar), packaging for a product (e.g. primary, secondary or tertiary packaging), a board game, a folder or file, an in-store display, promotional item (e.g. triangular table-top card) or wallpaper. The printed article can be formed from paper, card, cardboard or plastic. The substrate may be a laminate. The circuit may include discrete electronic components such as resistors, capacitors and inductors and integrated electronic components, such as microcontrollers. The circuit can include light emitting devices, such as light emitting diodes, displays, such as electrochromic displays, and/or sound emitting devices, such as speakers or buzzers.

The invention claimed is:

1. A printed article comprising:
   a substrate;
   an image printed on the substrate, wherein the image includes line art comprising conductive ink, the image including representations of at least two items which overlap such that line art of a first item is directly joined, at least at one connection point, to line art of a second item and the line arts of the first and second items include breaks in lines or at junctions which are imperceptible to the naked eye or hidden by an overlying layer of ink.

2. The printed article according to claim 1, wherein the image is a perspective image of the items.

3. The printed article according to claim 1, wherein the image comprises at least three items, wherein the representations of the first and second items overlap, the representations of the second and third items overlap and the representation of first and third items do not overlap.

4. A method of forming a printed article, the method comprising:
   providing an image which includes line art;
   arranging the line art so that representations of at least two items overlap such that line art of a first item is directly joined, at least at one connection point, to line art of a second item, the line arts of the first and second items include breaks in lines or at junctions which are imperceptible to the naked eye or hidden by an overlying layer of ink; and
   printing the line art using conductive ink.

5. The method according to claim 4, further comprising:
   mounting electronic components to the line art.

6. The printed article according to claim 1, wherein the line arts of the first and second items are formed in a single layer of conductive ink.

7. The method according to claim 4, wherein the line arts of the first and second items are formed in a single layer of conductive ink.

* * * * *